United States Patent
Liao et al.

(10) Patent No.: US 11,094,718 B2
(45) Date of Patent: Aug. 17, 2021

(54) TFT ARRAY SUBSTRATE

(71) Applicant: Wuhan China Star Optoelectronics Technology Co., Ltd., Wuhan (CN)

(72) Inventors: Zuomin Liao, Wuhan (CN); Yanyang Li, Wuhan (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 334 days.

(21) Appl. No.: 16/319,819

(22) PCT Filed: Sep. 27, 2018

(86) PCT No.: PCT/CN2018/107831
§ 371 (c)(1),
(2) Date: Jan. 22, 2019

(87) PCT Pub. No.: WO2019/205482
PCT Pub. Date: Oct. 31, 2019

(65) Prior Publication Data
US 2021/0126019 A1    Apr. 29, 2021

(30) Foreign Application Priority Data

Apr. 27, 2018 (CN) .......................... 201810394065.7

(51) Int. Cl.
*H01L 23/48* (2006.01)
*H01L 23/52* (2006.01)
(Continued)

(52) U.S. Cl.
CPC ...... *H01L 27/1237* (2013.01); *H01L 23/5226* (2013.01)

(58) Field of Classification Search
CPC .......... H01L 21/76802; H01L 27/1237; H01L 23/5226
See application file for complete search history.

(56) References Cited

U.S. PATENT DOCUMENTS

| 6,417,572 B1* | 7/2002 | Chidambarrao | H01L 23/5283 257/773 |
| 6,602,765 B2* | 8/2003 | Jiroku | H01L 21/2026 438/487 |

(Continued)

FOREIGN PATENT DOCUMENTS

| CN | 103984170 A | 8/2014 |
| CN | 107180838 A | 9/2017 |

(Continued)

*Primary Examiner* — Bradley Smith
*Assistant Examiner* — David J Goodwin
(74) *Attorney, Agent, or Firm* — Leong C. Lei

(57) ABSTRACT

The TFT array substrate has a third conductive layer connected to a first conductive layer and a second conductive layer through a first via and a second via, respectively. The third conductive layer further has separated first and second openings. The first opening has a vertical projection to a side of the second via and has an end extending beyond an edge of the second via adjacent to the first via. The second opening has a vertical projection to a side of the first via and has an end extending beyond an edge of the first via adjacent to the second via. As such, when the third conductive layer is stricken by static electricity, the first and second openings prevent a crack from breaking the first and second conductive layers apart, thereby enhancing the reliability of the connection between the first and second conductive layers.

3 Claims, 8 Drawing Sheets

(51) Int. Cl.
*H01L 27/12* (2006.01)
*H01L 23/522* (2006.01)

(56) References Cited

U.S. PATENT DOCUMENTS

| | | | | |
|---|---|---|---|---|
| 6,743,680 | B1* | 6/2004 | Yu | H01L 21/28211 |
| | | | | 438/285 |
| 7,872,698 | B2* | 1/2011 | Konishi | G02F 1/13458 |
| | | | | 349/43 |
| 8,650,161 | B1* | 2/2014 | Dasilva | G06F 16/2365 |
| | | | | 707/690 |
| 9,356,087 | B1* | 5/2016 | Lee | H01L 27/3209 |
| 9,941,120 | B2* | 4/2018 | Avdokhin | H01S 3/06754 |
| 2017/0168334 | A1 | 6/2017 | Yamaguchi | |
| 2017/0278977 | A1* | 9/2017 | Jeong | H01L 29/78606 |
| 2018/0108681 | A1* | 4/2018 | Ye | G02F 1/1368 |

FOREIGN PATENT DOCUMENTS

| | | | |
|---|---|---|---|
| CN | 107329338 | A | 11/2017 |
| CN | 108550580 | A | 9/2018 |

\* cited by examiner

TFT ARRAY SUBSTRATE

FIELD OF THE INVENTION

The present invention is generally related to the field of display technology, and more particularly to a thin film transistor (TFT) array substrate.

BACKGROUND OF THE INVENTION

In the field of display technologies, flat panel display devices such as liquid crystal display (LCD) devices, organic light emitting diode (OLED) devices, due to their thin thickness, high quality, power saving, and low radiation, have gradually replaced cathode ray tube (CRT) display devices.

Existing LCD devices are usually back-lighted display devices, and include a LCD panel and a backlight module. The LCD panel usually include a color filter (CF) substrate, a thin film transistor (TFT) array substrate, and a liquid crystal layer and a sealant disposed between the two substrates. The principle behind a LCD panel is to alter the alignment of the liquid crystal molecules in the liquid crystal layer by the electrical field formed between the substrates. As such, light from the backlight module is refracted to produce pictures.

An OLED device generally includes a substrate, an anode on the substrate, a hole injection layer (HIL) on the anode, a hole transport layer (HTL) on the hole injection layer, a lighting material layer on the hole transport layer, an electron transport layer (ETL) on the lighting material layer, an electron injection layer (EIL) on the electron injection layer, and a cathode on the electron injection layer. The operation principle of the OLED device is that light is produced by the injection and combination of electrons and holes as semiconductor and organic lighting material are driven by electrical field.

In existing display panel design, it is often required to connect two insulated metallic layers. For example, in a touch display panel, touch signals are input into a metallic layer of a TFT array substrate and the metallic layer is connected to a second metallic layer above. It is the second metallic layer that connects sensor terminals, thereby achieving a touch display panel. As shown in FIGS. 1 and 2, an existing TFT array substrate includes a first metallic layer 910, a first insulation layer 920 disposed on the first metallic layer 910, a second metallic layer 930 disposed on the first insulation layer 920, a second insulation layer 940 disposed on the first insulation layer 920 and the second metallic layer 930, and an indium tin oxide (ITO) layer 950 disposed on the second insulation layer 940. The second insulation layer 940 has two first vias 941 above the second metallic layer 930 and two second vias 942 above the first metallic layer 910. The first insulation layer 920 has third vias 921 above the first metallic layer 910. Each second via 942 is inside a third via 921. The ITO layer 950 contacts the second and first metallic layers 930 and 910 through the first and second vias 941 and 942, respectively, thereby achieving the connection between the first and second metallic layers 910 and 930. When static electricity caused by manufacturing process or from external environment accumulates on the ITO layer 950, the ITO layer 950 may be stricken by the static electricity, causing a crack between the first and second vias 941 and 942. The crack may extend towards the vias as shown in FIG. 3. When the crack reaches edges of the ITO layer 950, the ITO layer 950 would be separated into two parts connecting respectively with the first and second metallic layers 910 and 930. At this point, the first and second metallic layers 910 and 930 are no longer connected to each other, affecting the normal function and reliability of the display panel.

SUMMARY OF THE INVENTION

An objective of the present invention is to teach a TFT array substrate capable of sustaining static electricity's striking and breaking its conductive layer, thereby enhancing the TFT array substrate's reliability.

To achieve the objective, the present invention teaches a TFT array substrate, comprising a first conductive layer, a first insulation layer disposed on the first conductive layer, a second conductive layer disposed on the first insulation layer, a second insulation layer disposed on the second conductive layer and the first insulation layer, and a third conductive layer disposed on the second insulation layer; wherein the second insulation layer has a first via above the second conductive layer and a second via above the first conductive layer; the first insulation layer has a third via above the first conductive layer; the second via is inside the third via; the third conductive layer contacts the second and first conductive layers through the first and second vias, respectively;

the third conductive layer has a first opening and a second opening separated at a distance; the first opening has a vertical projection to a side of the second via and has an end extending beyond an edge of the second via adjacent to the first via; and the second opening has a vertical projection to a side of the first via and has an end extending beyond an edge of the first via adjacent to the second via.

The first opening has its vertical projection extending for a first upper portion beyond the edge of the second via adjacent to the first via; the second opening has its vertical projection extending for a second lower portion beyond the edge of the first via adjacent to the second via; the sum of the first upper and second lower portions' distances along a direction that the first and second vias are arranged is greater than a distance between projections of adjacent edges of the first and second vias to a same plane;

the vertical projections of the first and second openings are respectively at two opposite sides of a column of the first and second vias;

the first and second openings have rectangular shapes; and the first and second openings are extended along parallel directions.

The second insulation layer further has a fourth via above the second conductive layer and a fifth via above the first conductive layer; the first insulation layer further has a sixth via above the first conductive layer; the fifth via is inside the sixth via; the third conductive layer contacts the second and first conductive layers through the fourth and fifth vias, respectively; and the fourth, first, second, and fifth vias are sequentially aligned in a column.

The vertical projection of the first opening has another end extending for a first lower portion beyond an edge of the second via adjacent to the fifth via; the vertical projection of the second opening has another end extending for a second upper portion beyond an edge of the first via adjacent to the fourth via;

the third conductive layer further has a third opening and a fourth opening separated at a distance; the third opening has a vertical projection to a side of the fourth via and has an end extending for a third lower portion beyond an edge of the fourth via adjacent to the first via and another end extending beyond another edge of the fourth via away from the first via; the fourth opening has a vertical projection to a side of the fifth via and has an end extending for a fourth upper portion beyond an edge of the fifth via adjacent to the second via and another end extending beyond another edge of the fifth via away from the second via;

the third and first openings are arranged in a direction parallel to the direction that the first and second vias are arranged; and the second and fourth openings are arranged in a direction parallel to the direction that the first and second vias are arranged.

The sum of first lower and fourth upper portions' distances along a direction that the second and fifth vias are arranged is greater than a distance between projections of adjacent edges of the second and fifth vias a same plane;

the sum of second upper and third lower portions' distances along a direction that the fourth and first vias are arranged is greater than a distance between projections of adjacent edges of the fourth and first vias to a same plane;

the third and fourth openings have rectangular shapes; the third and fourth openings are extended along directions parallel to that of the first opening; and the first opening is extended along the direction that the first and second vias are arranged.

The third conductive layer further has a third opening, a fourth opening, a fifth opening, a sixth opening, a seventh opening, and an eighth opening separated at intervals;

the third opening has a vertical projection to a side of the first via and has an end extending beyond an edge of the first via adjacent to the fourth via for a third upper portion; the fourth opening has a vertical projection to a side of the fourth via and has an end extending beyond an edge of the fourth via adjacent to the first via for a fourth lower portion; the fifth opening has a vertical projection to a side of the fourth via and has an end extending beyond an edge of the fourth via away from the first via; the sixth opening has a vertical projection to a side of the fifth via and has an end extending beyond an edge of the fifth via adjacent to the second via; the seventh opening has a vertical projection to a side of the second via and has an end extending beyond an edge of the second via adjacent to the fifth via; the eighth opening has a vertical projection to a side of the fifth via and has an end extending beyond an edge of the fifth via away from the second via;

the fifth, third, first, and sixth openings are sequentially aligned in a column; the fifth, third, first, and sixth openings are arranged in the direction that the first and second vias are arranged;

the fourth, second, seventh, and eighth openings are sequentially aligned in a column; and the fourth, second, seventh, and eighth openings are arranged in the direction that the first and second vias are arranged.

The sum of the third upper and fourth lower portions' distances along a direction that the first and fourth vias are arranged is greater than a distance between adjacent edges of the first and fourth vias;

the vertical projection of the sixth opening has an end extending beyond the edge of the fifth via adjacent to the second via for a sixth upper portion; the vertical projection of the seventh opening has an end extending beyond the edge of the second via adjacent to the fifth via for a seventh lower portion; the sum of the sixth upper and seventh lower portions' distances along a direction that the second and fifth vias are arranged is greater than a distance between adjacent edges of the second and fifth vias;

the third, fourth, fifth, sixth, seventh, and eighth openings have rectangular shapes; the third, fourth, fifth, sixth, seventh, and eighth openings are extended along directions parallel to that of the first opening; and the first opening is extended along a direction forming a 45° included angle with the direction that the first and second vias are arranged.

The first opening has its vertical projection extending for a first upper portion beyond an edge of the second via adjacent to the first via; the first upper portion' distance along the direction that the first and second vias are arranged is greater than an distance between projections of adjacent edges of the first and second vias to a same plane; the second opening has its vertical projection extending for a second lower portion beyond an edge of the first via adjacent to the second via; the second lower portion' distance along the direction that the first and second vias are arranged is greater than the distance between projections of adjacent edges of the first and second vias to a same plane;

the third conductive layer further has a third opening, a fourth opening, a fifth opening, a sixth opening, a seventh opening, an eighth opening, a ninth opening, and a tenth opening separated at intervals;

the third and fourth openings have vertical projections to opposite sides of an edge of the fourth via adjacent to the first via extending beyond the edge of the fourth via adjacent to the first via for a third lower portion and a fourth lower portion, respectively; the third and fourth lower portions' distances along a direction that the first and fourth vias are arranged are both greater than a distance between adjacent edges of the first and fourth vias;

the fifth and sixth openings have vertical projections to opposite sides of an edge of the fifth via adjacent to the second via extending beyond the edge of the fifth via adjacent to the second via for a fifth upper portion and a sixth upper portion, respectively; the fifth and sixth upper portions' distances along a direction that the second and fifth vias are arranged are both greater than a distance between adjacent edges of the second and fifth vias;

the seventh and eighth openings have vertical projections to opposite sides of the fourth via, respectively, and the vertical projections have an end extending beyond an edge of the fourth via away from the first via; and the ninth and tenth openings have vertical projections to opposite sides of the fifth via, respectively, and the vertical projections have an end extending beyond an edge of the fifth via away from the second via.

The third, fourth, fifth, sixth, seventh, eighth, ninth, and tenth openings have rectangular shapes; and the third, fourth, fifth, sixth, seventh, eighth, ninth, and tenth openings are extended along directions parallel to that of the first opening; and the first opening is extended along the direction that the first and second vias are arranged.

The third conductive layer further has an eleventh opening, a twelfth opening, a thirteenth opening, and a fourteenth opening separated at intervals; the eleventh, twelfth, thirteenth, fourteenth openings have rectangular shapes;

the eleventh opening has a vertical projection to a side of the fourth opening away from the first via and is end-to-end connected to the seventh opening; the eleventh opening is extended along a direction perpendicular to that of the seventh opening;

the twelfth opening has a vertical projection to the side of the fourth opening away from the first via and is end-to-end connected to the eighth opening; the twelfth opening is extended along a direction perpendicular to that of the eighth opening;

the thirteenth opening has a vertical projection to a side of the fifth opening away from the second via and is end-to-end connected to the ninth opening; the thirteenth opening is extended along a direction perpendicular to that of the ninth opening;

the fourteenth opening has a vertical projection to the side of the fifth opening away from the second via and is end-to-end connected to the tenth opening; and the fourteenth opening is extended along a direction perpendicular to that of the tenth opening.

The advantages of the present invention are as follows. The TFT array substrate of the present invention has a third conductive layer connected to a first conductive layer and a second conductive layer through a first via and a second via, respectively. The third conductive layer further has separated first and second openings. The first opening has a vertical projection to a side of the second via and has an end extending beyond an edge of the second via adjacent to the first via. The second opening has a vertical projection to a side of the first via and has an end extending beyond an edge of the first via adjacent to the second via. As such, even though the third conductive layer is stricken by static electricity and a crack is formed between the adjacent edges of the first and second vias, the first and second openings prevent the crack from breaking the first and second conductive layers apart, thereby enhancing the reliability of the connection between the first and second conductive layers.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 1:
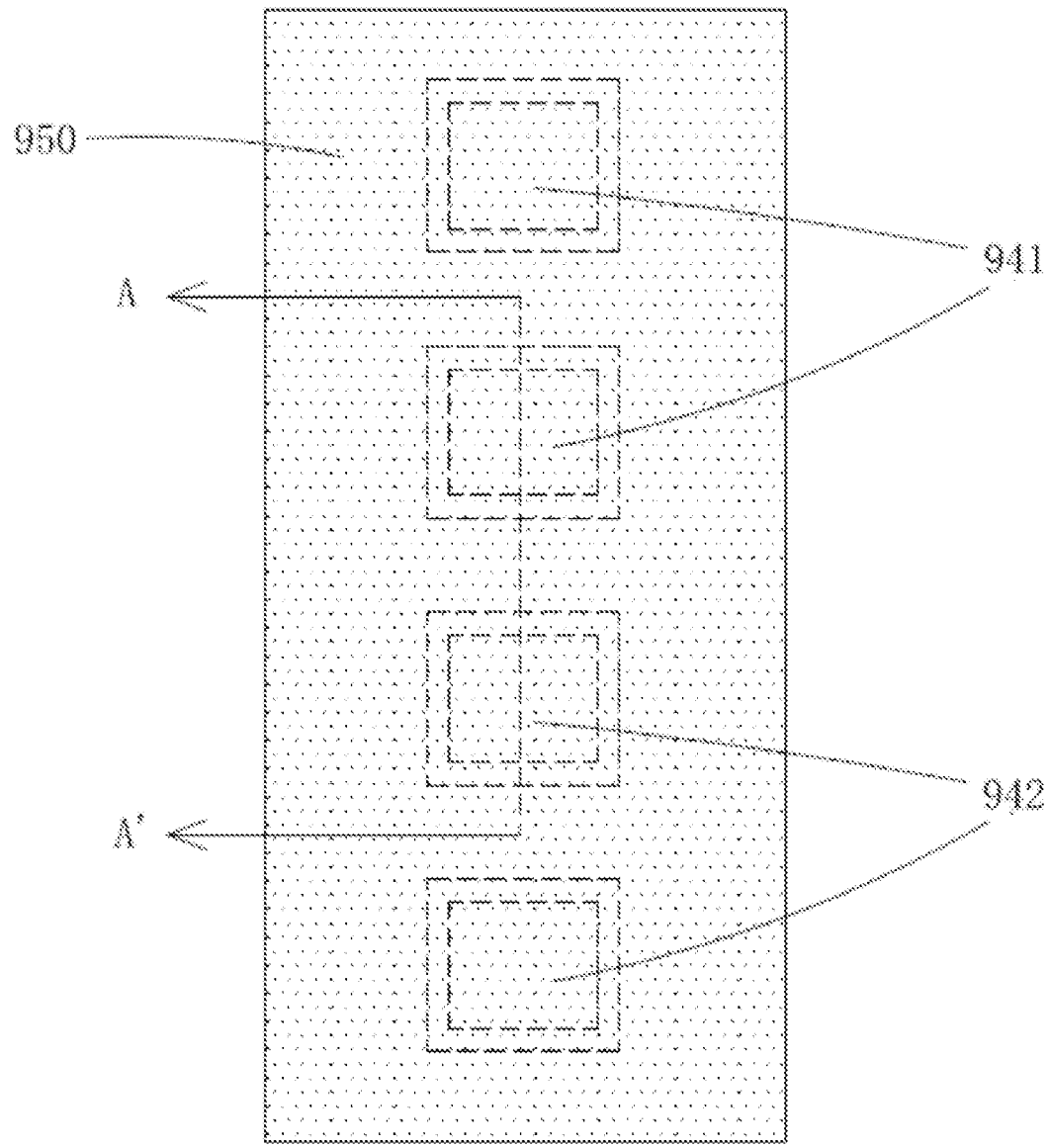
FIG. 1 is a top-view diagram showing a conventional TFT array substrate.
Figure 2:
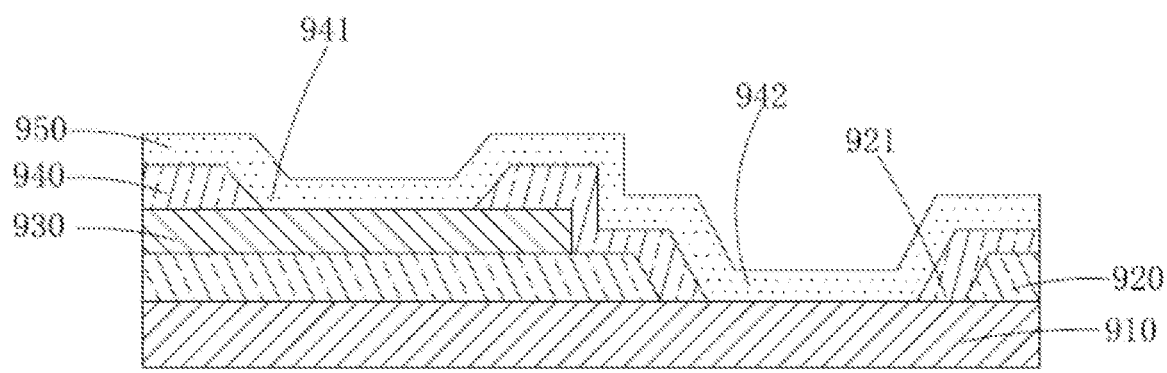
FIG. 2 is a sectional diagram showing the TFT array substrate of FIG. 1 along the A-A' line.
Figure 3:
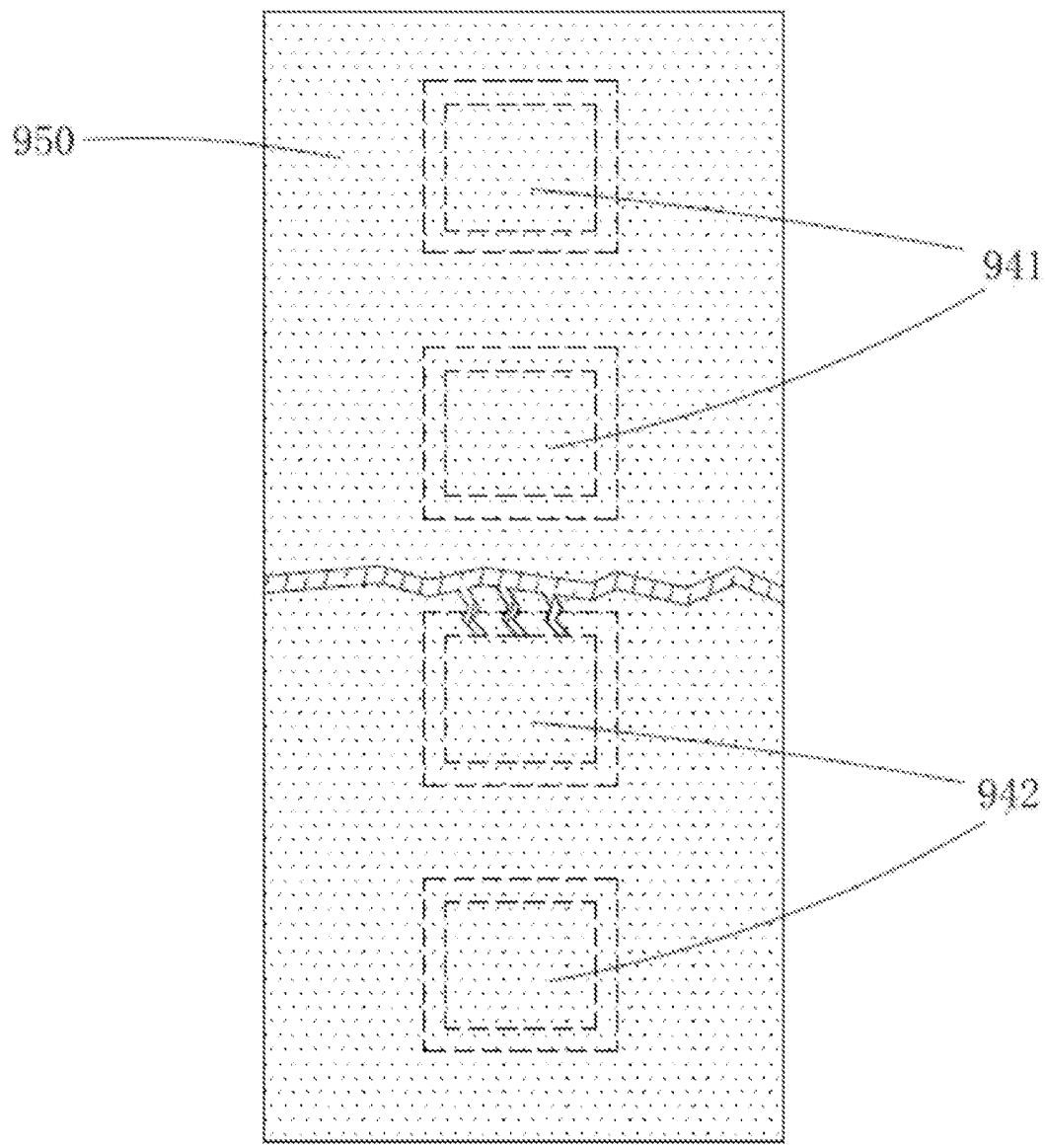
FIG. 3 is a schematic diagram showing the TFT array substrate of FIG. 1 broken by static electricity.
Figure 4:
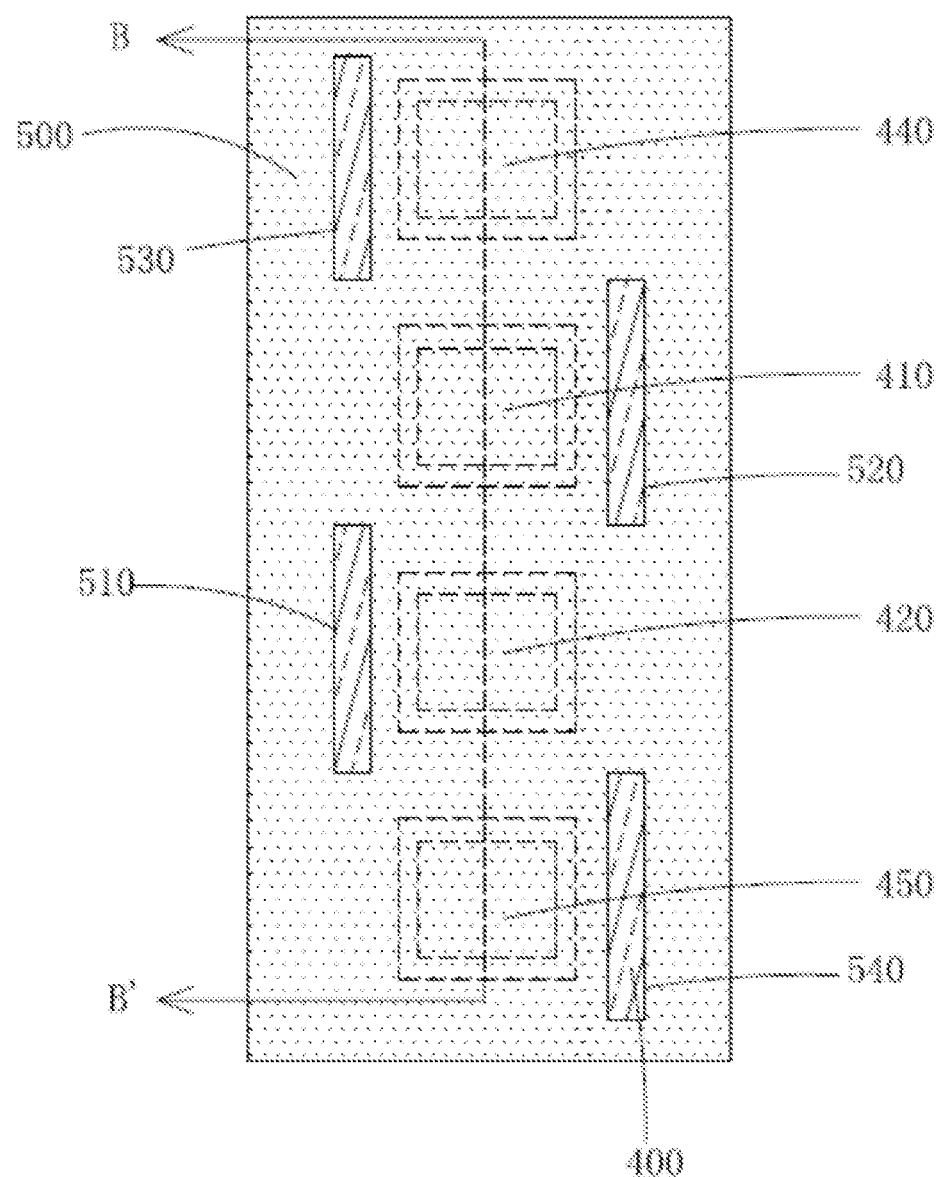
FIG. 4 is a top-view diagram showing a TFT array substrate according to a first embodiment of the present invention.
Figure 5:
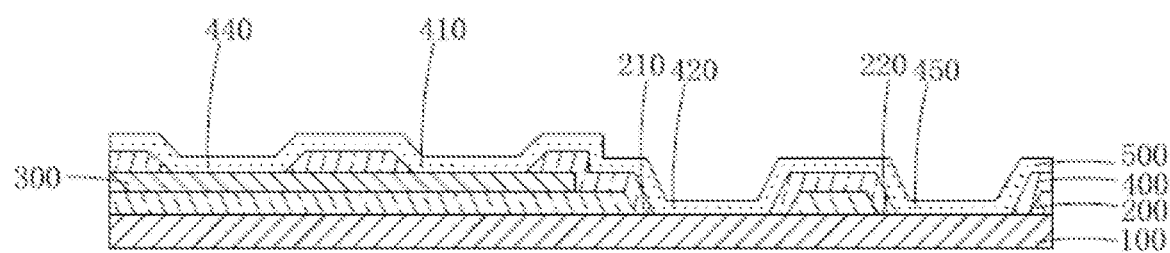
FIG. 5 is a sectional diagram showing the TFT array substrate of FIG. 4 along the B-B' line.

As shown in FIGS. 4 and 5, a TFT array substrate according to a first embodiment of the present invention includes a first conductive layer 100, a first insulation layer 200 disposed on the first conductive layer 100, a second conductive layer 300 disposed on the first insulation layer 200, a second insulation layer 400 disposed on the second conductive layer 300 and the first insulation layer 200, and a third conductive layer 500 disposed on the second insulation layer 400.

The second insulation layer 400 has a first via 410 above and exposing the second conductive layer 300, and a second via 420 above and exposing the first conductive layer 100. The first insulation layer 200 has a third via 210 above and exposing the first conductive layer 100. The second via 420 is inside the third via 210. The third conductive layer 500 contacts respectively with the second and first conductive layers 300 and 100 through the first and second vias 410 and 420.

The third conductive layer 500 has a first opening 510 and a second opening 520 separated at a distance. The first opening 510 has a vertical projection to a side of the second via 420 and has an end extending beyond an edge of the second via 420 adjacent to the first via 410. The second opening 520 has a vertical projection to a side of the first via 410 and has an end extending beyond an edge of the first via 410 adjacent to the second via 420.

Specifically, as shown in FIG. 4, the first opening 510 has its vertical projection extending for a first upper portion beyond the edge of the second via 420 adjacent to the first via 410. The second opening 520 has its vertical projection extending for a second lower portion beyond the edge of the first via 410 adjacent to the second via 420. The sum of first upper and second lower portions' distances along a direction that the first and second vias 410 and 420 are arranged is equal to a distance between the projections of the adjacent edges of the first and second vias 410 and 420 to a same plane. Of course, alternative embodiments of the present invention may have the sum of first upper and second lower portions' distances along the direction that the first and second vias 410 and 420 are arranged is greater than the distance between the projections of the adjacent edges of the first and second vias 410 and 420 to the same plane.

Preferably, as shown in FIG. 4, the vertical projections of the first and second openings 510 and 520 are respectively at two opposite sides of the column of the first and second vias 410 and 420. Both the first and second openings 510 and 520 have rectangular shapes. The first and second openings 510 and 520 are extended along parallel directions.

Specifically, as shown in FIGS. 4 and 5, the second insulation layer 400 further has a fourth via 440 above and exposing the second conductive layer 300, and a fifth via 450 above and exposing the first conductive layer 100. The first insulation layer 200 further has a sixth via 220 above and exposing the first conductive layer 100. The fifth via 450 is inside the sixth via 220. The third conductive layer 500 contacts respectively with the second and first conductive layers 300 and 100 through the fourth and fifth vias 440 and 450. The fourth, first, second, and fifth vias 440, 410, 420, and 450 are sequentially aligned in a column.

Specifically, as shown in FIG. 4, the vertical projection of the first opening 510 has another end extending for a first lower portion beyond an edge of the second via 420 adjacent to the fifth via 450. The vertical projection of the second opening 520 has another end extending for a second upper portion beyond an edge of the first via 410 adjacent to the fourth via 440. The third conductive layer 500 further has a third opening 530 and a fourth opening 540 separated at a distance. The third opening 530 has a vertical projection to a side of the fourth via 440, and has an end extending for a third lower portion beyond an edge of the fourth via 440 adjacent to the first via 410 and another end extending beyond another edge of the fourth via 440 away from the first via 410. The fourth opening 540 has a vertical projection to a side of the fifth via 450, and has an end extending for a fourth upper portion beyond an edge of the fifth via 450 adjacent to the second via 420 and another end extending beyond another edge of the fifth via 450 away from the second via 420.

Specifically, the third and first openings 530 and 510 are arranged in a direction parallel to the direction that the first and second vias 410 and 420 are arranged. The second and fourth openings 520 and 540 are arranged in a direction parallel to the direction that the first and second vias 410 and 420 are arranged.

Specifically, as shown in FIG. 4, the sum of first lower and fourth upper portions' distances along a direction that the second and fifth vias 420 and 450 are arranged is equal to a distance between the projections of the adjacent edges of the second and fifth vias 420 and 450 to a same plane. The sum of second upper and third lower portions' distances along a direction that the fourth and first vias 440 and 410 are arranged is equal to a distance between the projections of the adjacent edges of the fourth and first vias 440 and 410 to a same plane. Of course, alternative embodiments of the present invention may have the sum of third and fourth upper portions' distances along the direction that the second and fifth vias 420 and 450 are arranged is greater than the distance between the projections of the adjacent edges of the second and fifth vias 420 and 450 to a same plan. Alternative embodiments may also have the sum of second upper and third lower portions' distances along the direction that the fourth and first vias 440 and 410 are arranged is greater than the distance between the projections of the adjacent edges of the fourth and first vias 440 and 410 to a same plane.

Preferably, as shown in FIG. 4, both the third and fourth openings 530 and 540 have rectangular shapes. The third and fourth openings 530 and 540 are extended along directions parallel to that of the first opening 510. The first opening 510 is extended along the direction that the first and second vias 410 and 420 are arranged.

Specifically, the first and second conductive layers 100 and 300 are made of metals. The third conductive layer 500 is made of indium tin oxide (ITO).

Figure 6:
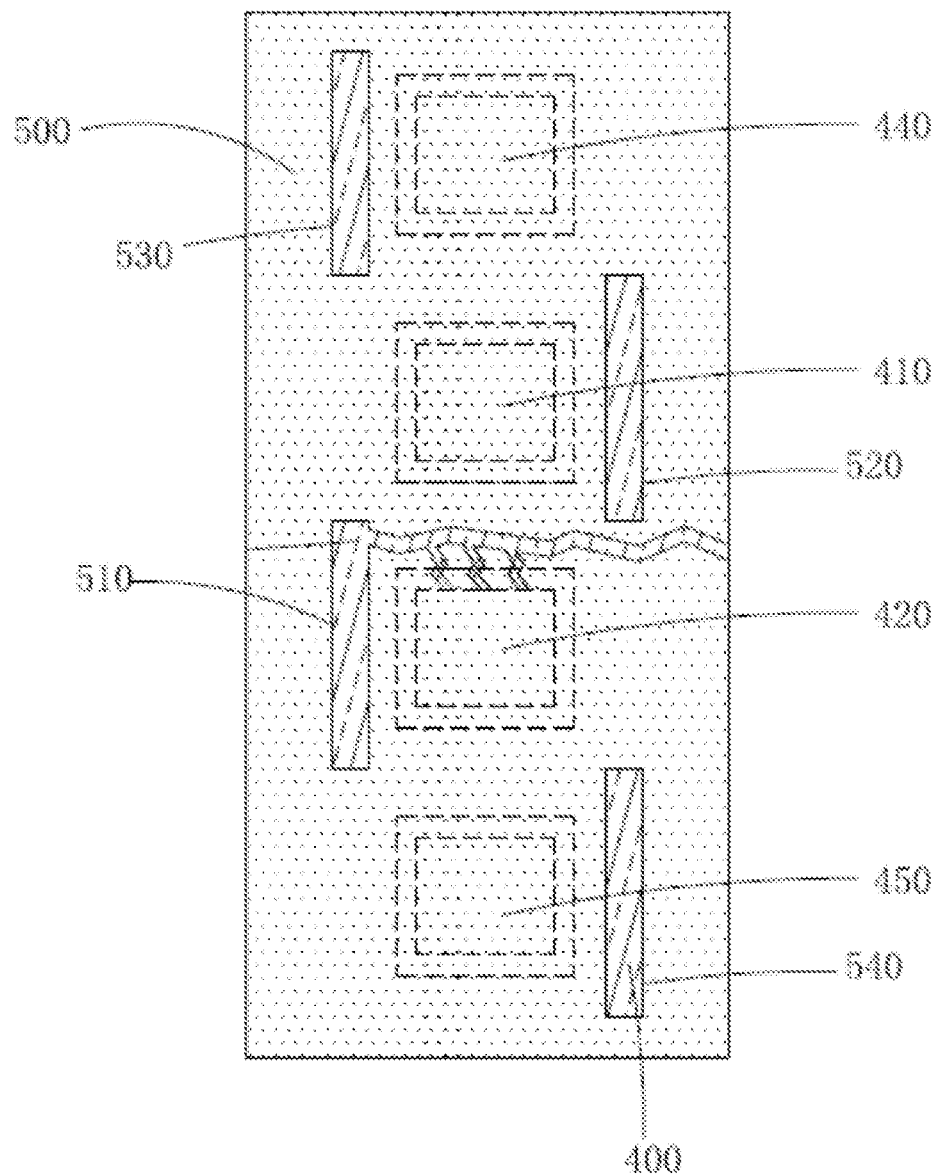
FIG. 6 is a schematic diagram showing the TFT array substrate of FIG. 4 broken by static electricity.

It should be noted that, for the TFT array substrate of the first embodiment, when the third conductive layer 500 is broken by static electricity between the first and second vias 410 and 420 as shown in FIG. 6, due to the presence of the first and second openings 510 and 520, the crack does not extend and the third conductive layer 500 would remain connected in the TFT array substrate of the first embodiment, thereby enhancing the reliability of the connection between the first and second conductive layers 100 and 300 through the third conductive layer 500. Furthermore, the addition of the fourth and fifth vias 440 and 450 in the first embodiment provides additional connectivity between the first and second conductive layers 100 and 300 through the third conductive layer 500. Then, due to the presence of the third and fourth openings 530 and 540, a crack in the third conductive layer 500 between the first and fourth vias 410 and 440 by static electricity does not extend and the third conductive layer 500 would remain connected in the TFT array substrate of the first embodiment. When a crack occurs by static electricity in the third conductive layer 500 between the second and fourth vias 420 and 450, due to the presence of the first and fourth openings 510 and 540, the crack does not extend and the third conductive layer 500 remains connected, enhancing its connection reliability.

Figure 7:
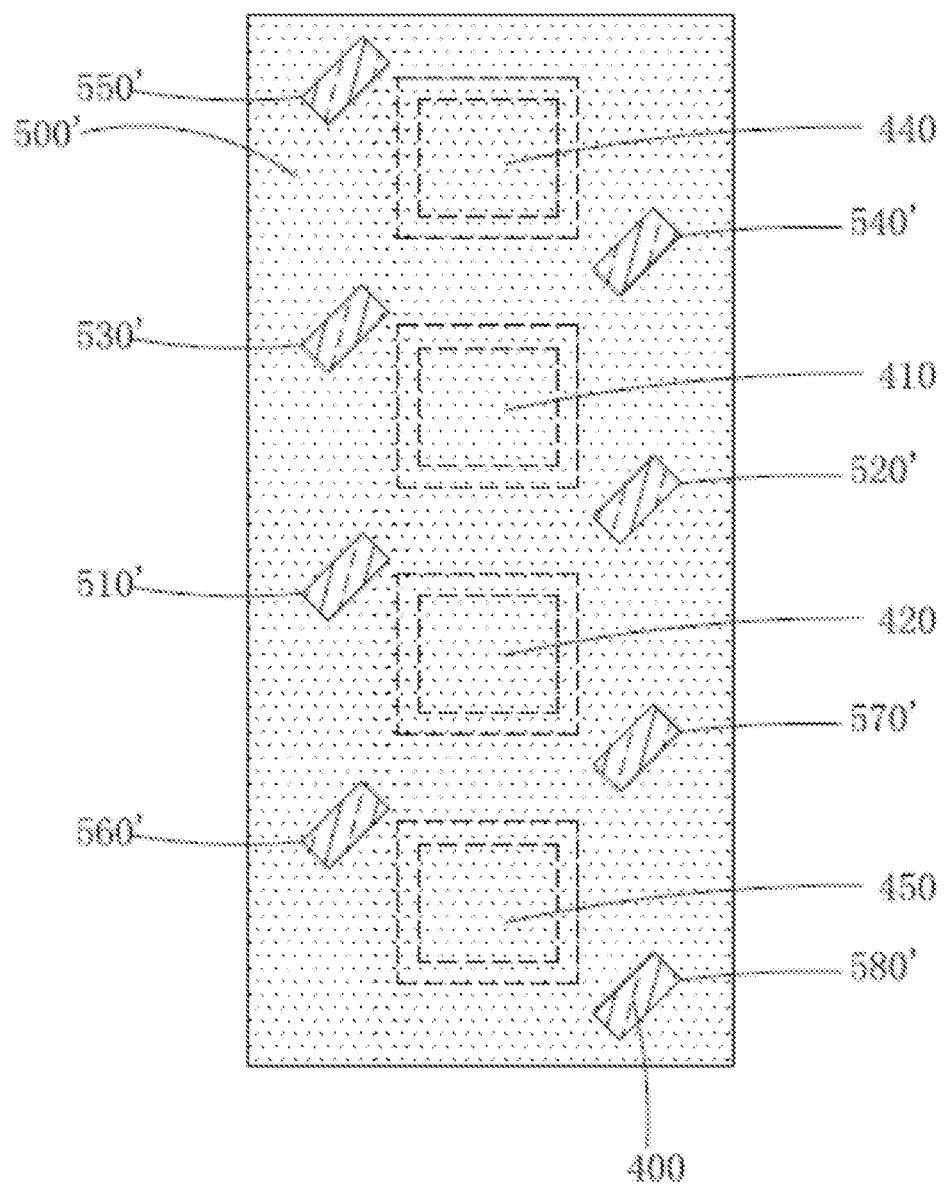
FIG. 7 is a top-view diagram showing a TFT array substrate according to a second embodiment of the present invention.

As shown in FIG. 7, the TFT array substrate of a second embodiment of the present invention is different from the previous first embodiment in that the vertical projection of the first opening 510' does not have its another end extending beyond the edge of the second via 420 adjacent to the fifth via 450, and the vertical projection of the second opening 520' does not have its another end extending beyond the edge of the first via 410 adjacent to the fourth via 440. The third conductive layer 500' further includes a third opening 530', a fourth opening 540', a fifth opening 550', a sixth opening 560', a seventh opening 570', and an eighth opening 580' separated at intervals. The third opening 530' has a vertical projection to a side of the first via 410 and the vertical projection has an end extending beyond the edge of the first via 410 adjacent to the fourth via 440. The fourth opening 540' has a vertical projection to a side of the fourth via 440 and the vertical projection has an end extending beyond the edge of the fourth via 440 adjacent to the first via 410. The fifth opening 550' has a vertical projection to a side of the fourth via 440 and the vertical projection has an end extending beyond the edge of the fourth via 440 away from the first via 410. The sixth opening 560' has a vertical projection to a side of the fifth via 450 and the vertical projection has an end extending beyond the edge of the fifth via 450 adjacent to the second via 420. The seventh opening 570' has a vertical projection to a side of the second via 420 and the vertical projection has an end extending beyond the edge of the second via 420 adjacent to the fifth via 450. The eighth opening 580' has a vertical projection to a side of the fifth via 450 and the vertical projection has an end extending beyond the edge of the fifth via 450 away from the second via 420.

Specifically, as shown in FIG. 7, in the second embodiment of the present invention, the fifth, third, first, and sixth openings 550', 530', 510', and 560' are sequentially aligned in a column along a direction parallel to the direction that the first and second vias 410 and 420 are arranged. The fourth, second, seventh, and eighth openings 540', 520', 570', and 580' are sequentially aligned in a column along a direction parallel to the direction that the first and second vias 410 and 420 are arranged.

Furthermore, as shown in FIG. 7, the vertical projection of the third opening 530' has an end extending beyond the edge of the first via 410 adjacent to the fourth via 440 for a third upper portion. The vertical projection of the fourth opening 540' has an end extending beyond the edge of the fourth via 440 adjacent to the first via 410 for a fourth lower portion. The sum of the third upper and fourth lower portions' distances along a direction that the first and fourth vias 410 and 440 are arranged is greater than a distance between the adjacent edges of the first and fourth vias 410 and 440. The vertical projection of the sixth opening 560' has an end extending beyond the edge of the fifth via 450 adjacent to the second via 420 for a sixth upper portion. The vertical projection of the seventh opening 570' has an end extending beyond the edge of the second via 420 adjacent to the fifth via 450 for a seventh lower portion. The sum of the sixth upper and seventh lower portions' distances along a direction that the second and fifth vias 420 and 450 are arranged is greater than a distance between the adjacent edges of the second and fifth vias 420 and 450. Of course, in alternative embodiments, the sum of the third upper and fourth lower portions' distances along the direction that the first and fourth vias 410 and 440 are arranged is equal to the distance between the adjacent edges of the first and fourth vias 410 and 440. The sum of the sixth upper and seventh lower portions' distances along the direction that the second and fifth vias 420 and 450 are arranged is equal to the distance between the adjacent edges of the second and fifth vias 420 and 450.

Figure 8:
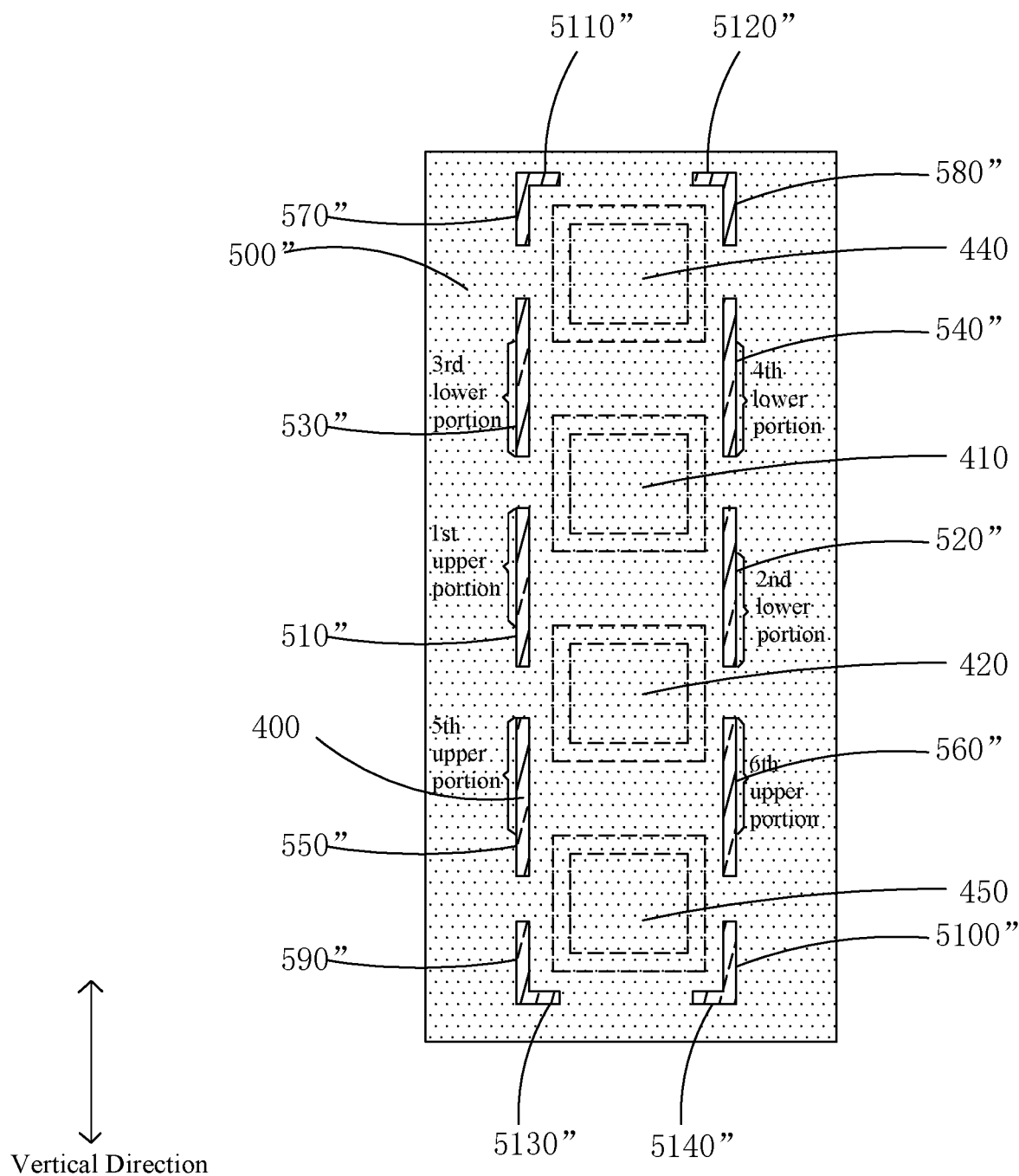
FIG. 8 is a top-view diagram showing a TFT array substrate according to a third embodiment of the present invention.

Specifically, as shown in FIG. 8, the third to eighth openings 530', 540', 550', 560', 570', and 580' have rectangular shapes, and are extended along directions parallel to that of the first opening 510'. The first opening 510' is extended along the direction that the first and second vias 410 and 420 are arranged.

The rest of the structure is identical to the first embodiment and the details are omitted here.

It should be noted that, for the TFT array substrate of the second embodiment, when the third conductive layer 500' is broken by static electricity and a crack is formed between the first and second vias 410 and 420, due to the presence of the first and second openings 510' and 520', the crack does not extend and the third conductive layer 500' would remain connected. In the meantime, due to the presence of the third and fourth openings 530' and 540', a crack formed between the first and fourth vias 410 and 440 does not extend to edges of the third conductive layer 500'. Due to the presence of the seventh and sixth openings 570' and 560', a crack formed between the second and fifth vias 420 and 450 does not extend to edges of the third conductive layer 500'. Similarly, a crack formed to a side of the fourth via 440 away from the first via 410 does not extend to edges of the third conductive layer 500' due to the fifth opening 550', and a crack formed to a side of the fifth via 450 away from the second via 420 does not extend to edges of the third conductive layer 500' due to the eighth opening 580'. The openings are extended along a direction forming a 45° included angle relative to the direction that the first and second vias 410 and 420 are arranged. As such, a crack along the direction that the first and second vias 410 and 420 are arranged is prevented from reaching edges of the third conductive layer 500'. As such, the third conductive layer 500' remains connected even though it is stricken by static electricity, thereby enhancing the reliability of the connection between the first and second conductive layers 100 and 300 through the third conductive layer 500'.

As shown in FIG. 8, the TFT array substrate of a third embodiment of the present invention is different from the previous first embodiment in that the vertical projection of the first opening 510" does not have its another end extending beyond the edge of the second via 420 adjacent to the fifth via 450, and the vertical projection of the second opening 520" does not have its another end extending beyond the edge of the first via 410 adjacent to the fourth via 440. The first opening 510" has its vertical projection extending for a first upper portion beyond the edge of the second via 420 adjacent to the first via 410. The first upper portion' distance along the direction that the first and second vias 410 and 420 are arranged is greater than the distance between the projections of the adjacent edges of the first and second vias 410 and 420 to a same plane. The second opening 520" has its vertical projection extending for a second lower portion beyond the edge of the first via 410 adjacent to the second via 420. The second lower portion' distance along the direction that the first and second vias 410 and 420 are arranged is greater than the distance between the projections of the adjacent edges of the first and second vias 410 and 420 to a same plane.

Specifically, as shown in FIG. 8, in the third embodiment of the present invention, the third conductive layer 500" further includes a third opening 530", a fourth opening 540", a fifth opening 550", a sixth opening 560", a seventh opening 570", an eighth opening 580", a ninth opening 590", and a tenth opening 5100" separated at intervals.

The third and fourth openings 530" and 540" have vertical projections to opposite sides of an edge of the fourth via 440 adjacent to the first via 410, and extending beyond the edge of the fourth via 440 adjacent to the first via 410 for a third lower portion and a fourth lower portion, respectively. The third and fourth lower portions' distances along the direction that the first and fourth vias 410 and 440 are arranged are both greater than the distance between the adjacent edges of the first and fourth vias 410 and 440.

The fifth and sixth openings 550" and 560" have vertical projections to opposite sides of an edge of the fifth via 450 adjacent to the second via 420, and extending beyond the edge of the fifth via 450 adjacent to the second via 420 for a fifth upper portion and a sixth upper portion, respectively. The fifth and sixth upper portions' distances along the direction that the second and fifth vias 420 and 450 are arranged are both greater than the distance between the adjacent edges of the second and fifth vias 420 and 450.

The seventh and eighth openings 570" and 580" have vertical projections to opposite sides of the fourth via 440, respectively, and the vertical projections have an end extending beyond the edge of the fourth via 440 away from the first via 410.

The ninth and tenth openings 590" and 5100" have vertical projections to opposite sides of the fifth via 450, respectively, and the vertical projections have an end extending beyond the edge of the fifth via 450 away from the second via 420.

Specifically, as shown in FIG. 8, the third to tenth openings 530", 540", 550", 560", 570", 580", 590", and 5100" have rectangular shapes, and are extended along directions parallel to that of the first opening 510". The first opening 510" is extended along the direction that the first and second vias 410 and 420 are arranged.

Furthermore, as shown in FIG. 8, in the third embodiment of the present invention, the third conductive layer 500" further includes an eleventh opening 5110", a twelfth opening 5120", a thirteenth opening 5130", and a fourteenth opening 5140" separated at intervals and all having rectangular shapes.

The eleventh opening 5110" has a vertical projection to a side of the fourth opening 440 away from the first via 410 and is end-to-end connected to the seventh opening 570". The eleventh opening 5110" is extended along a direction perpendicular to that of the seventh opening 570".

The twelfth opening 5120" has a vertical projection to a side of the fourth opening 440 away from the first via 410 and is end-to-end connected to the eighth opening 580". The twelfth opening 5120" is extended along a direction perpendicular to that of the eighth opening 580".

The thirteenth opening 5130" has a vertical projection to a side of the fifth opening 450 away from the second via 420 and is end-to-end connected to the ninth opening 590". The thirteenth opening 5130" is extended along a direction perpendicular to that of the ninth opening 590".

The fourteenth opening 5140" has a vertical projection to a side of the fifth opening 450 away from the second via 420 and is end-to-end connected to the tenth opening 5100". The fourteenth opening 5140" is extended along a direction perpendicular to that of the tenth opening 5100".

It should be noted that, for the TFT array substrate of the third embodiment, when the third conductive layer 500" is broken by static electricity and a crack is formed between the first and second vias 410 and 420, due to the presence of the first and second openings 510" and 520", the crack does not extend and the third conductive layer 500" would remain connected. In the meantime, due to the presence of the third and fourth openings 530" and 540", a crack formed between the first and fourth vias 410 and 440 does not extend to edges of the third conductive layer 500". Due to the presence of the fifth and sixth openings 550" and 560", a crack formed between the second and fifth vias 420 and 450 does not extend to edges of the third conductive layer 500". Similarly, due to the presence of the seventh and eighth openings 570" and 580", a crack formed to a side of the fourth via 440 away from the first via 410 does not extend to edges of the third conductive layer 500". Due to the presence of the ninth and tenth openings 590" and 5100", a crack formed to a side of the fifth via 450 away from the second via 420 does not extend to edges of the third conductive layer 500". Furthermore, As such, the third conductive layer 500" remains connected even though it is stricken by static electricity, thereby enhancing the reliability of the connection between the first and second conductive layers 100 and 300 through the third conductive layer 500". Furthermore, a crack along the direction that the first and second vias 410 and 420 are arranged is prevented from reaching edges of the third conductive layer 500" due to the eleventh, twelfth, thirteenth, and fourteenth openings 5110, 5120, 5130, and 5140.

As described above, the TFT array substrate of the present invention has a third conductive layer connected to a first conductive layer and a second conductive layer through a first via and a second via, respectively. The third conductive layer further has separated first and second openings. The first opening has a vertical projection to a side of the second via and has an end extending beyond an edge of the second via adjacent to the first via. The second opening has a vertical projection to a side of the first via and has an end extending beyond an edge of the first via adjacent to the second via. As such, even though the third conductive layer is stricken by static electricity and a crack is formed between the adjacent edges of the first and second vias, the first and second openings prevent the crack from breaking the first and second conductive layers apart, thereby enhancing the reliability of the connection between the first and second conductive layers.

Above are embodiments of the present invention, which does not limit the scope of the present invention. Any equivalent amendments within the spirit and principles of the embodiment described above should be covered by the protected scope of the invention.

What is claimed is:

1. . A thin film transistor (TFT) array substrate, comprising a first conductive layer, a first insulation layer disposed on the first conductive layer, a second conductive layer disposed on the first insulation layer, a second insulation layer disposed on the second conductive layer and the first insulation layer, and a third conductive layer disposed on the second insulation layer; wherein the second insulation layer has a first via above the second conductive layer and a second via above the first conductive layer; the first insulation layer has a third via above the first conductive layer; the second via is inside the third via;

the second insulation layer further has a fourth via above the second conductive layer and a fifth via above the first conductive layer; the first insulation layer further has a sixth via above the first conductive layer; the fifth via is inside the sixth via;

the third conductive layer contacts the second and first conductive layers through the first and second vias, respectively; the third conductive layer contacts the second and first conductive layers through the fourth and fifth vias, respectively;

the fourth, first, second, and fifth vias are sequentially aligned in a column;

the third conductive layer has a first opening and a second opening separated at a distance; the first opening has a projection along a vertical direction to a side of the second via and has an end extending for a first upper portion beyond an edge of the second via adjacent to the first via; and the second opening has a projection along the vertical direction to a side of the first via and has an end extending for a second lower portion beyond an edge of the first via adjacent to the second via;

the distances of the first upper portion and the second lower portion along the vertical direction are greater than a distance between the first and second vias along the vertical direction;

the third conductive layer further has a third opening, a fourth opening, a fifth opening, a sixth opening, a seventh opening, an eighth opening, a ninth opening, and a tenth opening separated at intervals;

the third and fourth openings have respective projections along the vertical direction to opposite sides of an edge of the fourth via adjacent to the first via; the third and fourth openings respectively extend beyond the edge of the fourth via adjacent to the first via for a third lower portion and a fourth lower portion; the third and fourth lower portions' distances along the vertical direction are both greater than a distance between adjacent edges of the first and fourth vias along the vertical direction;

the fifth and sixth openings have respective projections along the vertical direction to opposite sides of an edge of the fifth via adjacent to the second via; the fifth and sixth openings respectively extend beyond the edge of the fifth via adjacent to the second via for a fifth upper portion and a sixth upper portion; the fifth and sixth upper portions' distances along the vertical direction are both greater than a distance between adjacent edges of the second and fifth vias along the vertical direction;

the seventh and eighth openings have respective projections along the vertical direction to opposite sides of the fourth via; the seventh and eighth openings respectively have an end extending beyond an edge of the fourth via away from the first via;

the ninth and tenth openings have respective projections along the vertical direction to opposite sides of the fifth via; and the ninth and tenth openings respectively have an end extending beyond an edge of the fifth via away from the second via.

2. The TFT array substrate according to claim 1, wherein the first, second, third, fourth, fifth, sixth, seventh, eighth, ninth, and tenth openings have rectangular shapes; and the second, third, fourth, fifth, sixth, seventh, eighth, ninth, and tenth openings are extended along directions parallel to that of the first opening; and the first opening is extended along the direction that the first and second vias are arranged.

3. The TFT array substrate according to claim 2, wherein the third conductive layer further has an eleventh opening, a twelfth opening, a thirteenth opening, and a fourteenth opening separated at intervals; the eleventh, twelfth, thirteenth, fourteenth openings have rectangular shapes;

the eleventh opening is positioned to a side of the fourth opening away from the first via and is end-to-end connected to the seventh opening; the eleventh opening is extended along a direction perpendicular to that of the seventh opening;

the twelfth opening is positioned to the side of the fourth opening away from the first via and is end-to-end connected to the eighth opening; the twelfth opening is extended along a direction perpendicular to that of the eighth opening;

the thirteenth opening is positioned to a side of the fifth opening away from the second via and is end-to-end connected to the ninth opening; the thirteenth opening is extended along a direction perpendicular to that of the ninth opening;

the fourteenth opening is positioned to the side of the fifth opening away from the second via and is end-to-end connected to the tenth opening; and the fourteenth opening is extended along a direction perpendicular to that of the tenth opening.

* * * * *